(12) United States Patent
Ikenaga et al.

(10) Patent No.: US 9,929,468 B2
(45) Date of Patent: Mar. 27, 2018

(54) VARIABLE CAPACITANCE DEVICE AND ANTENNA DEVICE

(71) Applicant: TAIYO YUDEN CO., LTD., Tokyo (JP)

(72) Inventors: Tomokazu Ikenaga, Tokyo (JP); Daiki Ishii, Tokyo (JP); Masashi Natsume, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 121 days.

(21) Appl. No.: 14/823,809

(22) Filed: Aug. 11, 2015

(65) Prior Publication Data

US 2016/0049730 A1  Feb. 18, 2016

(30) Foreign Application Priority Data

Aug. 12, 2014  (JP) .................................. 2014-164039
Jul. 27, 2015  (JP) .................................. 2015-147654

(51) Int. Cl.
| | | |
|---|---|---|
| *H04B 1/18* | (2006.01) | |
| *H01Q 7/00* | (2006.01) | |
| *H03H 5/12* | (2006.01) | |
| *H03H 7/01* | (2006.01) | |

(52) U.S. Cl.
CPC ............. *H01Q 7/005* (2013.01); *H03H 5/12* (2013.01); *H03H 7/0153* (2013.01)

(58) Field of Classification Search
USPC ............................ 455/193.1–193.3, 121–125
See application file for complete search history.

(56) References Cited

U.S. PATENT DOCUMENTS

| | | | | |
|---|---|---|---|---|
| 3,569,795 | A * | 3/1971 | Gikow ...................... | H01G 7/06 361/321.1 |
| 9,147,527 | B2 * | 9/2015 | Ikenaga ................... | H01L 28/55 |
| 2004/0164819 | A1 * | 8/2004 | Mishima .................. | H01G 4/33 333/174 |
| 2006/0139227 | A1 * | 6/2006 | Shigihara ................. | H01Q 1/38 343/788 |
| 2010/0056098 | A1 | 3/2010 | Kanno et al. | |

(Continued)

FOREIGN PATENT DOCUMENTS

| | | |
|---|---|---|
| JP | 2005-64437 A | 3/2005 |
| JP | 2008-66682 A | 3/2008 |

(Continued)

*Primary Examiner* — Edward Urban
*Assistant Examiner* — Rui Hu
(74) *Attorney, Agent, or Firm* — Chen Yoshimura LLP

(57) ABSTRACT

The variable capacitance device includes one or more of directional elements inserted between the third and fourth terminals that allow current to pass only in prescribed directions, such that a diagram formed of current paths from the third terminal to the fourth terminal for the plurality of third-terminal side resistors and the plurality of fourth-terminal side resistors when the third terminal is biased higher than the fourth terminal is line-symmetric to a diagram formed of current paths from the fourth terminal to the third terminal for the plurality of third-terminal side resistors and the plurality of fourth-terminal side resistors when the fourth terminal is biased higher than the third terminal, with respect to the serial chain of variable capacitance elements between the first and second terminals.

6 Claims, 12 Drawing Sheets

(56) References Cited

U.S. PATENT DOCUMENTS

| | | | |
|---|---|---|---|
| 2011/0134582 A1 | 6/2011 | Kanno | |
| 2014/0139968 A1* | 5/2014 | Ikenaga | H01G 7/06 361/281 |
| 2014/0227978 A1* | 8/2014 | Ikeda | H01Q 7/00 455/41.2 |
| 2015/0133064 A1* | 5/2015 | Horne | H03H 7/40 455/77 |
| 2015/0294795 A1* | 10/2015 | Ueki | H01G 4/40 361/56 |
| 2016/0133387 A1* | 5/2016 | Kanno | H04B 5/0075 307/109 |

FOREIGN PATENT DOCUMENTS

| | | |
|---|---|---|
| JP | 2010-55570 A | 3/2010 |
| JP | 2011-119482 A | 6/2011 |

\* cited by examiner

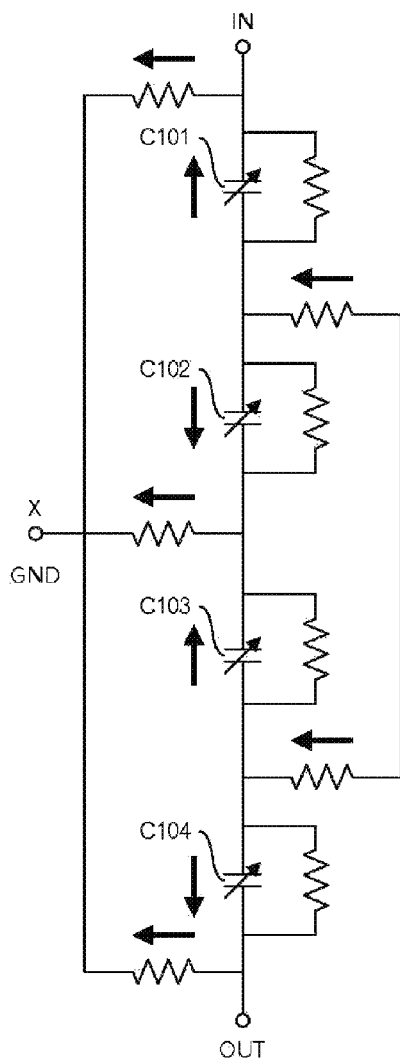
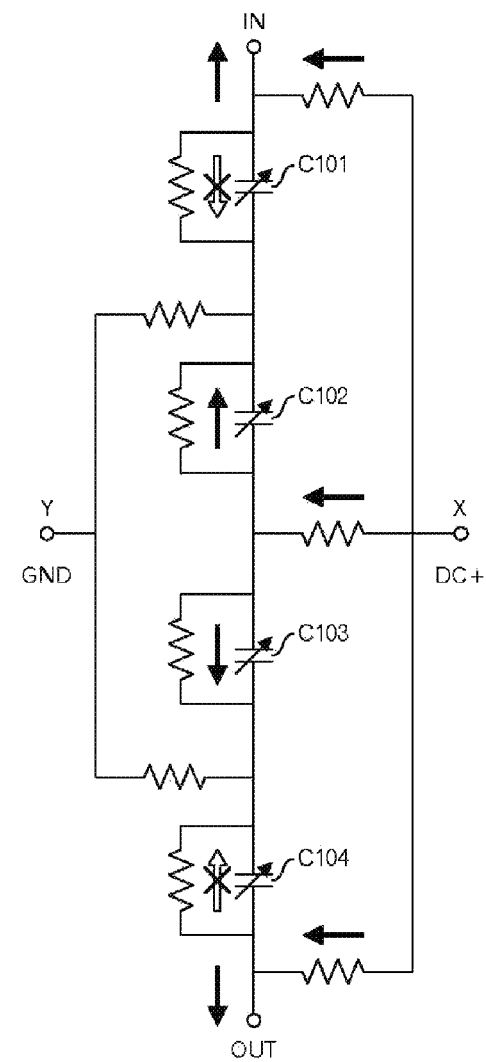
FIG. 1A
Prior Art
FIG. 1B
Prior Art

| Positive Connection | C101 | C102 | C103 | C104 | Total | Change |
|---|---|---|---|---|---|---|
| 0V Applied | 400 | 400 | 400 | 400 | 100 | 33% |
| 3V Applied | 268 | 268 | 268 | 268 | 67 | |

| Reverse Connection | C101 | C102 | C103 | C104 | Total | Change |
|---|---|---|---|---|---|---|
| 0V Applied | 400 | 400 | 400 | 400 | 100 | 20% |
| 3V Applied | 400 | 268 | 268 | 400 | 80 | |

FIG. 2

| | C1 | C2 | C3 | C4 | Total | Change |
|---|---|---|---|---|---|---|
| 0V Applied | 400 | 400 | 400 | 400 | 100 | 32% |
| 3V Applied | 272 | 272 | 272 | 272 | 68 | | ns # VARIABLE CAPACITANCE DEVICE AND ANTENNA DEVICE

BACKGROUND OF THE INVENTION

Technical Field

The present invention relates to a variable capacitance device and an antenna device that utilizes the variable capacitance device.

Background Art

In NFC (near field communication) modules used for mobile FeliCa, a phenomenon has been known to occur in which reception sensitivity decreases as a result of the resonant frequency shifting away from 13.56 MHz due to variations in the antenna coil, for example. To correct these shifts in the resonant frequency, frequency adjustment circuits that include capacitors are placed inside the modules, all parts are inspected before the modules are shipped, and the capacitance of the capacitors is minutely adjusted.

Conventionally, switched capacitors, in which FET (field effect transistor) switches are connected in series in a fixed capacitance element, have been used. Switchover settings are then written onto a control IC (integrated circuit) during the pre-shipping inspection, and when NFC is being used, the module switches over to the FET mode and adjusts the capacitance of the capacitor.

However, general-purpose ceramic capacitors, which have become cheaper than FET switches in recent years and which can handle high voltages, have been considered as a possible replacement for FET switches. Ceramic capacitor materials have a property that has been actively utilized: the capacitance decreases as a DC bias voltage is applied.

The capacitance of ceramic capacitors changes over time, however, which is a problem. This has led to consideration of using variable capacitance devices that utilize a plurality of variable capacitance elements that include a dielectric formed via a thin film instead of by sintering.

Since conventional variable capacitance devices have directionality due to their structure, however, there is the possibility that if the capacitor is mounted incorrectly, an adequate change in capacitance will not be achieved when voltage is applied.

FIGS. 1A and 1B show an example configuration of a conventional variable capacitance device. In the conventional variable capacitance device, capacitors C101 to C104 are connected in series between the input terminal IN and the output terminal OUT, and terminals X and Y, which are used for applying bias voltage, are provided respectively on the left side and the right side of the device, for example. As shown in FIG. 1A, the correct configuration (also referred to as a "positive connection") is to connect the terminal X, which is connected to the variable capacitance elements C101 to C104 via three resistors, to the ground GND and to then apply a prescribed voltage DC+ to the terminal Y, which is connected to the variable capacitance elements C101 to C104 via two resistors. Current flows from the terminal Y to the terminal X, as shown by the arrows.

FIG. 1B, on the other hand, shows an incorrect configuration (known as a "reverse connection") in which the terminal Y is connected to the ground GND, and the prescribed voltage DC+ is applied to the terminal X. In such a case, current flows from the terminal X to the terminal Y, as shown by the arrows, which means that current does not flow to the variable capacitance elements C101 and C104 and there is no change in the applied voltage.

As shown in FIG. 2, in a positive connection, the capacitance of each of the variable capacitance elements C101 to C104 is 400 nF when DC+=0V, and the capacitance of each of the capacitance elements decreases by 33% to 268 nF when DC+=+3V, for example. This means that the overall capacitance is 100 nF when DC+=0V and 67 nF when DC+=+3V, which means that the overall capacitance also changes by 33%.

In a reverse connection, on the other hand, the capacitance of the variable capacitance elements C102 and C103 decreases by 33% to 268 nF when DC+=+3V, but the capacitance of the variable capacitance elements C101 and C104 does not change. Therefore, the overall capacitance is 100 nF when DC+=0V and 80 nF when DC+=+3V, which means that the overall capacitance only changes by 20%.

This means that there will be instances in which the capacitance of the capacitor cannot be properly adjusted and variations in the resonant frequency cannot be fully corrected.

RELATED ART DOCUMENTS

Patent Documents

Patent Document 1: Japanese Patent Application Laid-Open Publication No. 2010-55570
Patent Document 2: Japanese Patent Application Laid-Open Publication No. 2011-119482
Patent Document 3: Japanese Patent Application Laid-Open Publication No. 2008-66682
Patent Document 4: Japanese Patent Application Laid-Open Publication No. 2005-64437

SUMMARY OF THE INVENTION

Accordingly, the present invention is directed to a variable capacitance device and an antenna device that substantially obviate one or more of the problems due to limitations and disadvantages of the related art.

An object of the present invention is to provide a variable capacitance device in which terminals on either side of the device can be used to receive bias voltage.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a variable capacitance device, including: a first terminal and a second terminal for receiving signals to be processed; a serial chain of variable capacitance elements connected in series between the first terminal and the second terminal, each of the variable capacitance elements being configured to change a capacitance thereof in accordance with a voltage across the variable capacitance element, the serial chain having nodes at respective ends of the variable capacitance elements connected in series; a third terminal and a fourth terminal for receiving a bias voltage for adjusting a total capacitance between said first terminal and said second terminal; a plurality of third-terminal side resistors, the number of which is one greater than the number of the variable capacitance elements in the serial chain, the third-terminal side resistors being connected to the third terminal on one end, the other ends of the respective third-terminal side resistors being respectively connected to the nodes of the serial chain of variable capacitance elements; and a plurality of fourth-terminal side resistors, the number of which is one greater than the number of the variable capacitance elements in the serial chain, the fourth-terminal side resistors being connected to the fourth terminal on one end, the other ends of the respective third-terminal side resistors being respectively connected to the nodes of the serial chain of variable capacitance elements, wherein the variable capacitance device includes one or more of directional elements inserted between the third and fourth terminals that allow current to pass only in prescribed directions, such that a diagram formed of current paths from the third terminal to the fourth terminal for the plurality of third-terminal side resistors and the plurality of fourth-terminal side resistors when the third terminal is biased higher than the fourth terminal is line-symmetric to a diagram formed of current paths from the fourth terminal to the third terminal for the plurality of third-terminal side resistors and the plurality of fourth-terminal side resistors when the fourth terminal is biased higher than the third terminal, with respect to the serial chain of variable capacitance elements between the first and second terminals.

The plurality of third-terminal side resistors and the plurality of fourth-terminal side resistors may be each numbered consecutively from the first terminal to the second terminal for identification purposes, and said one or more of directional elements may include: a first diode inserted between odd numbered third-terminal side resistors and the third terminal, an anode of the first diode being connected to each of said one ends of the odd numbered third-terminal side resistors, a cathode of the first diode being connected to the third terminal; a second diode inserted between even numbered third-terminal side resistors and the third terminal, a cathode of the second diode being connected to each of said one ends of the even numbered third-terminal side resistors, an anode of the second diode being connected to the third terminal; a third diode inserted between odd numbered fourth-terminal side resistors and the fourth terminal, an anode of the third diode being connected to each of said one ends of the odd numbered fourth-terminal side resistors, a cathode of the third diode being connected to the fourth terminal; and a fourth diode inserted between even numbered fourth-terminal side resistors and the fourth terminal, a cathode of the fourth diode being connected to each of said one ends of the even numbered fourth-terminal side resistors, an anode of the fourth diode being connected to the fourth terminal.

Said one or more of directional elements may be a plurality of diodes configured such that: each of the odd numbered third-terminal side resistors has one diode inserted and connected in series thereto between the corresponding node and the third terminal, an anode of the diode being on a side of the corresponding node and a cathode of the diode being on a side of the third terminal; each of the even numbered third-terminal side resistors has one diode inserted and connected in series thereto between the corresponding node and the third terminal, a cathode of the diode being on a side of the corresponding node and an anode of the diode being on a side of the third terminal; each of the odd numbered fourth-terminal side resistors has one diode inserted and connected in series thereto between the corresponding node and the fourth terminal, an anode of the diode being on a side of the corresponding node and a cathode of the diode being on a side of the fourth terminal; and each of the even numbered fourth-terminal side resistors has one diode inserted and connected in series thereto between the corresponding node and the fourth terminal, a cathode of the diode being on a side of the corresponding node and an anode of the diode being on a side of the fourth terminal.

In another aspect, the present invention provides a variable capacitance device, including: a first terminal and a second terminal for receiving signals to be processed; a plurality of variable capacitance elements connected in series between the first terminal and the second terminal, each of the variable capacitance element being configured to change a capacitance thereof in accordance with a voltage across the variable capacitance element; a third terminal and a fourth terminal for receiving a bias voltage for adjusting a total capacitance between said first terminal and said second terminal; a plurality of first bias voltage circuits that are each connected to the third terminal and that each allow current to flow therein only in a first direction; a plurality of second bias voltage circuits that are each connected to the fourth terminal and that each allow current to flow therein only in the first direction; a plurality of third bias voltage circuits that are each connected to the third terminal and that each allow current to flow therein in only a second direction that is opposite to said first direction; and a plurality of fourth bias voltage circuits that are each connected to the fourth terminal and that each allow current to flow therein only in the second direction, wherein, with respect to a series of successive nodes that begins with the first terminal, followed by a plurality of nodes that connect two adjacent variable capacitance elements in a serial chain of the plurality of variable capacitance elements, and that ends with the second terminal, a node to which one of the plurality of first bias voltage circuits and one of the plurality of fourth bias voltage circuits are connected and a node to which one of the plurality of second bias voltage circuits and one of the plurality of third bias voltage circuits are connected are alternately arranged.

According to at least some aspects of the present invention, a variable capacitance device that does not have directionality can be obtained.

It is to be understood that both the foregoing general description and the following detailed description are exemplary and explanatory, and are intended to provide further explanation of the invention as claimed.

BRIEF DESCRIPTION OF THE DRAWINGS

FIG. 1A is a diagram used to describe a conventional variable capacitance device.

FIG. 1B is a diagram used to describe a conventional variable capacitance device.

FIG. 2 is a table used to describe a conventional variable capacitance device.

DETAILED DESCRIPTION OF EMBODIMENTS

Embodiment 1

Figure 3:
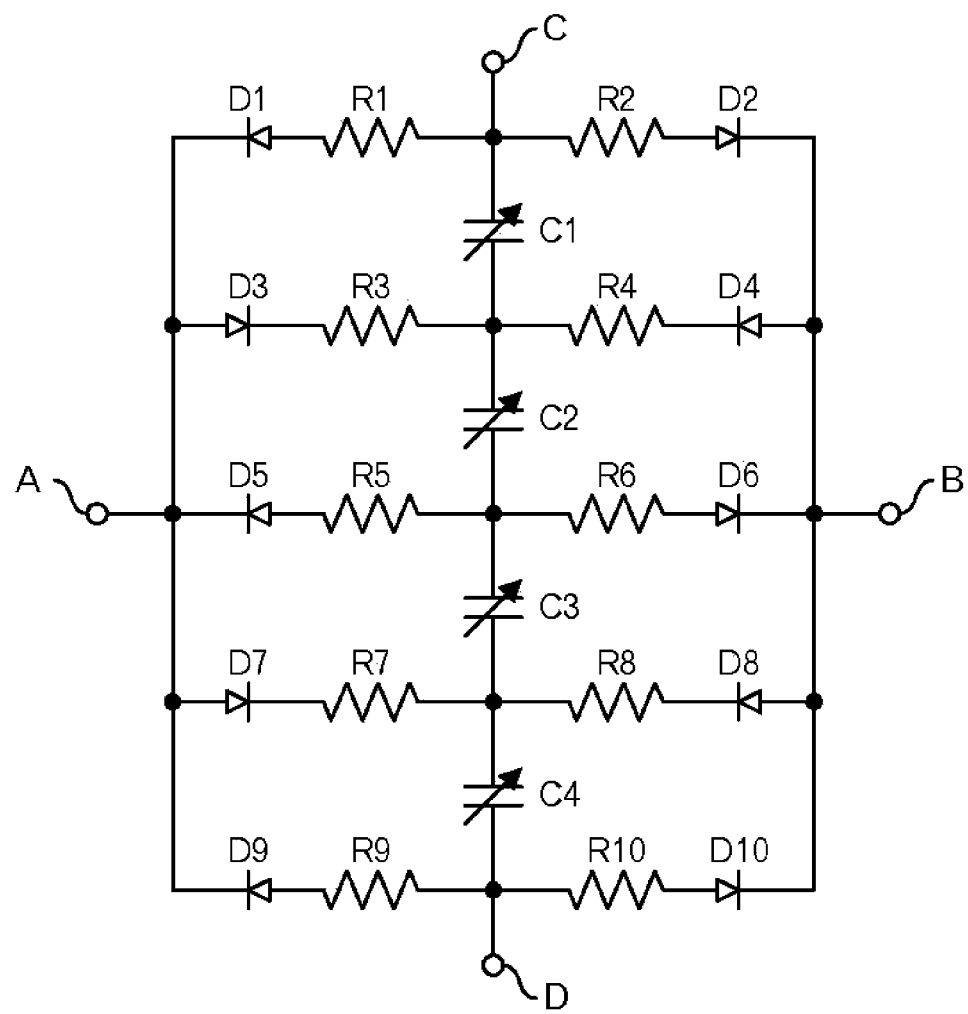
FIG. 3 illustrates an example circuit configuration of a variable capacitance device according to Embodiment 1 of the present invention.

FIG. 3 illustrates an example circuit in a variable capacitance device according to Embodiment 1 of the present invention. In the present embodiment, variable capacitance elements C1 to C4 are connected in series between signal terminals C and D. In addition, the variable capacitance device according to the present embodiment has diodes D1 to D10 and resistors R1 to R10. The diodes D1 to D10 have identical properties, and the resistors R1 to R10 have the same resistance, for example.

In order for applied bias current to pass between terminal A and terminal B, series circuits that contain resistors and diodes connect the terminal A side and the terminal B side at the following: the edge on the terminal C side of the variable capacitance element C1; the connecting part at which the variable capacitance element C1 and the variable capacitance element C2 are connected; the connecting part at which the variable capacitance element C2 and the variable capacitance element C3 are connected; the connecting part at which the variable capacitance element C3 and the variable capacitance element C4 are connected; and the edge on the terminal D side of the variable capacitance element C4.

In the example from FIG. 3, in a first series circuit containing the diode D1 and the resistor R1 (of which one end is connected to the anode of the diode D1), the cathode of the diode D1 is connected to the terminal A and the other end of the resistor R1 is connected to one end of the variable capacitance element C1. Current does not flow from the terminal A to the variable capacitance element C1 via the first series circuit.

In a second series circuit containing the diode D3 and the resistor R3 (of which one end is connected to the cathode of the diode D3), the anode of the diode D3 is connected to the terminal A and the other end of the resistor R3 is connected to the connecting part at which variable capacitance elements C1 and C2 are connected. Current flows from the terminal A to the variable capacitance elements C1 and C2 via the second series circuit.

In a third series circuit containing the diode D5 and the resistor R5 (of which one end is connected to the anode of the diode D5), the cathode of the diode D5 is connected to the terminal A and the other end of the resistor R5 is connected to the connecting part at which the variable capacitance elements C2 and C3 are connected. Current does not flow from the terminal A to the variable capacitance elements C2 and C3 via the third series circuit. Moreover, the third series circuit is identical to the first series circuit.

In a fourth series circuit containing the diode D7 and the resistor R7 (of which one end is connected to the cathode of the diode D7), the anode of the diode D7 is connected to the terminal A and the other end of the resistor R7 is connected to the connecting part at which the variable capacitance elements C3 and C4 are connected. Current flows from the terminal A to the variable capacitance elements C3 and C4 via the fourth series circuit. Moreover, the fourth series circuit is identical to the second series circuit.

In a fifth series circuit containing the diode D9 and the resistor R9 (of which one end is connected to the anode of the diode D9), the cathode of the diode D9 is connected to the terminal A and the other end of the resistor R9 is connected to one end of the variable capacitance element C4. Current does not flow from the terminal A to the variable capacitance element C4 via the fifth series circuit. Moreover, the fifth series circuit is identical to the first and third series circuits.

In a sixth series circuit containing the diode D2 and the resistor R2 (of which one end is connected to the anode of the diode D2), the cathode of the diode D2 is connected to the terminal B and the other end of the resistor R2 is connected to one end of the variable capacitance element C1. Current does not flow from the terminal B to the variable capacitance element C1 via this sixth series circuit.

In a seventh series circuit containing the diode D4 and the resistor R4 (of which one end is connected to the cathode of the diode D4), the anode of the diode D4 is connected to the terminal B and the other end of the resistor R4 is connected to the connecting part at which the variable capacitance elements C1 and C2 are connected. Current flows from the terminal B to the variable capacitance elements C1 and C2 via the seventh series circuit.

In an eighth series circuit containing the diode D6 and the resistor R6 (of which one end is connected to the anode of the diode D6), the cathode of the diode D6 is connected to the terminal B and the other end of the resistor R6 is connected to the connecting part at which the variable capacitance elements C2 and C3 are connected. Current does not flow from the terminal B to the variable capacitance elements C2 and C3 via the eighth series circuit. Moreover, the eighth series circuit is identical to the sixth series circuit.

In a ninth series circuit containing the diode D8 and the resistor R8 (of which one end is connected to the cathode of the diode D8), the anode of the diode D8 is connected to the terminal B and the other end of the resistor R8 is connected to the connecting part at which the variable capacitance elements C3 and C4 are connected. Current flows from the terminal B to the variable capacitance elements C3 and C4 via the ninth series circuit. Moreover, the ninth series circuit is identical to the seventh series circuit.

In a tenth series circuit containing the diode D10 and the resistor R10 (of which one end is connected to the anode of the diode D10), the cathode of the diode D10 is connected to the terminal B, and the other end of the resistor R10 is connected to one end of the variable capacitance element C4. Current does not flow from the terminal B to the variable capacitance element C4 via the tenth series circuit. Moreover, the tenth series circuit is identical to the sixth and eighth series circuits.

In this way, series circuits (the first, third, and fifth series circuits) in which current flows toward the terminal A side and series circuits (the second and fourth series circuits) in which current does not flow toward the terminal A side are alternately connected to the terminal A in numerical order from top to bottom.

Meanwhile, series circuits (the sixth, eighth, and tenth series circuits) in which current flows toward the terminal B side and series circuits (the seventh and ninth series circuits)

in which current does not flow toward the terminal B side are alternately connected to the terminal B in numerical order from top to bottom.

This means that the first to tenth series circuits are connected so as to be axisymmetric with respect to a straight line connecting the terminals C and D.

Figure 4:
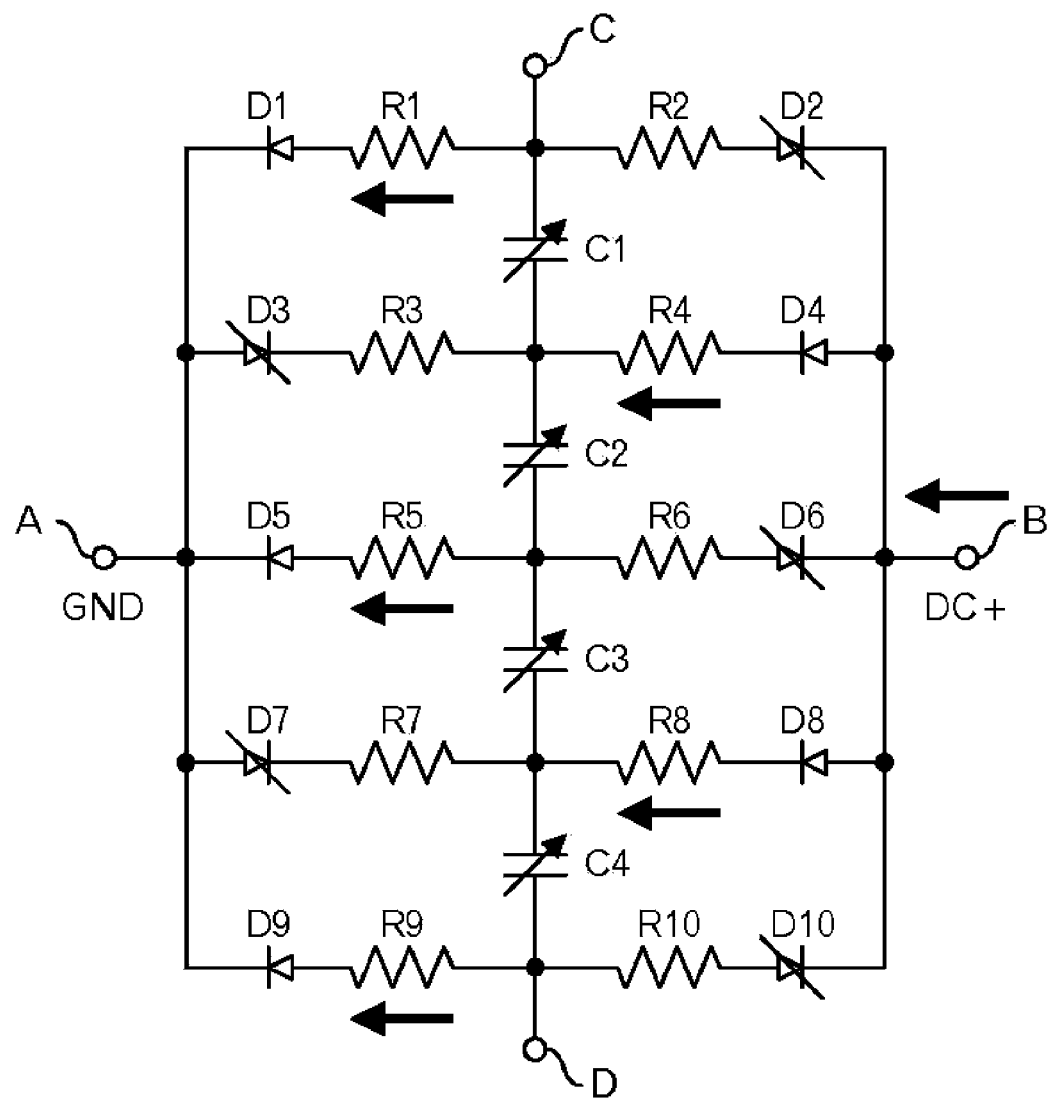
FIG. 4 schematically illustrates the flow of current in Embodiment 1 when a bias voltage is applied in a first direction.

The arrows in FIG. 4 indicate how, in such a configuration, current will flow when the terminal A is connected to the ground GND and DC+ is applied at the terminal B. Current will flow along the seventh series circuit and the ninth series circuit, and will additionally flow along the first series circuit, the third series circuit, and the fifth series circuit via the variable capacitance elements C1 to C4. In this way, two ladder-like series circuits are formed, with these circuits being disposed to either side of the variable capacitance elements C1 to C4. In these ladder-like series circuits, current flows from the terminal B to the terminal A and alternates, segment-to-segment, between the left and the right sides of the variable capacitance elements C1 to C4. In other words, a bias voltage is applied to all of the variable capacitance elements C1 to C4.

Figure 5:
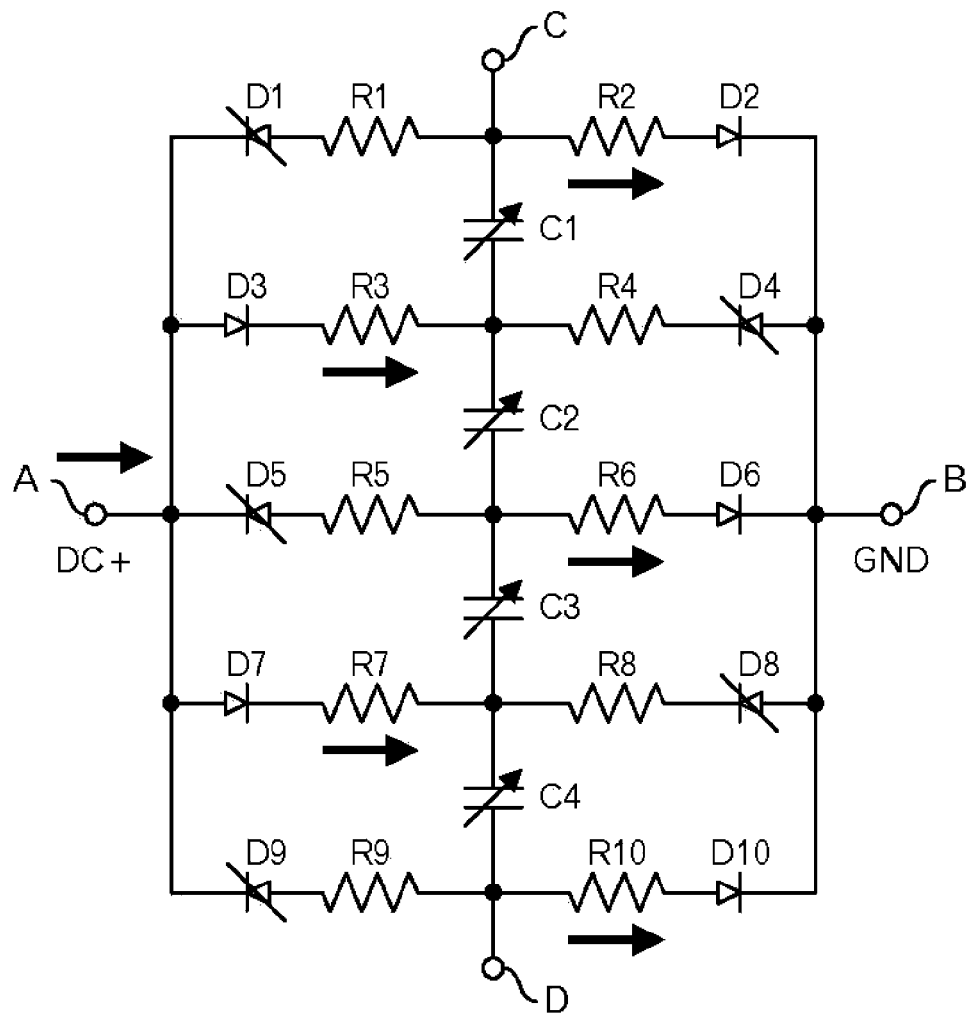
FIG. 5 schematically illustrates the flow of current in Embodiment 1 when a bias voltage is applied in a second direction.

Meanwhile, the arrows in FIG. 5 indicate how current will flow when the terminal B is connected to the ground GND and DC+ is applied at the terminal A. Current will flow along the second series circuit and the fourth series circuit, and additionally flow along the sixth series circuit, the eighth series circuit, and the tenth series circuit via the variable capacitance elements C1 to C4. In the example shown in FIG. 5 as well, two ladder-like series circuits are formed, with these circuits being disposed to the left and the right of the variable capacitance elements C1 to C4. In these ladder-like series circuits, current flows from the terminal A to the terminal B and alternates, segment-to-segment, between the left and the right sides of the variable capacitance elements C1 to C4. In other words, a bias voltage is applied to all of the variable capacitance elements C1 to C4.

In this way, the first to tenth series circuits are used as circuits to apply voltage to the variable capacitance elements C1 to C4.

Figures 6, 7:
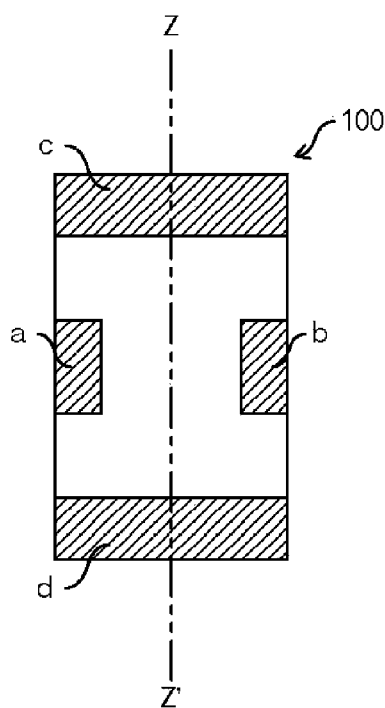
FIG. 6 is a table used to describe a change in capacitance in the present embodiment.
FIG. 7 is a bottom view of a mounting example of a variable capacitance device.

Therefore, regardless of whether the device is connected as shown in FIG. 4 or as shown in FIG. 5, if DC+=+3V, the capacitance of each of the variable capacitance elements will decrease by 32%, which means that the overall capacitance also changes by 32%, as shown in FIG. 6. As was mentioned earlier, the change in capacitance in a conventional configuration with a positive connection was 33%. In the example shown here, however, the change is 1% smaller. This is due to the influence of the diodes, as well as other factors. However, this effect is much smaller than that observed on the change in capacitance in a conventional configuration with a reverse connection.

When a circuit configuration like the one shown in FIG. 3 is placed, as a small film, in a cuboid variable capacitance device like the device shown in FIG. 7 (bottom view), for example, the terminal C becomes connected to an external terminal c of the variable capacitance device 100, the terminal D becomes connected to an external terminal d of the variable capacitance device 100, the terminal A becomes connected to an external terminal a of the variable capacitance device 100, and the terminal B becomes connected to an external terminal b of the variable capacitance device 100. Such a variable capacitance device 100 is symmetric with respect to a straight line that passes through center of the device in a longitudinal direction from Z to Z'. As a result, there is no need to distinguish between the external terminal a and the external terminal b, and the variable capacitance device 100 cannot be mounted improperly. The disposition and the shape of the external terminals a to d is identical to that in conventional devices.

Figure 8:
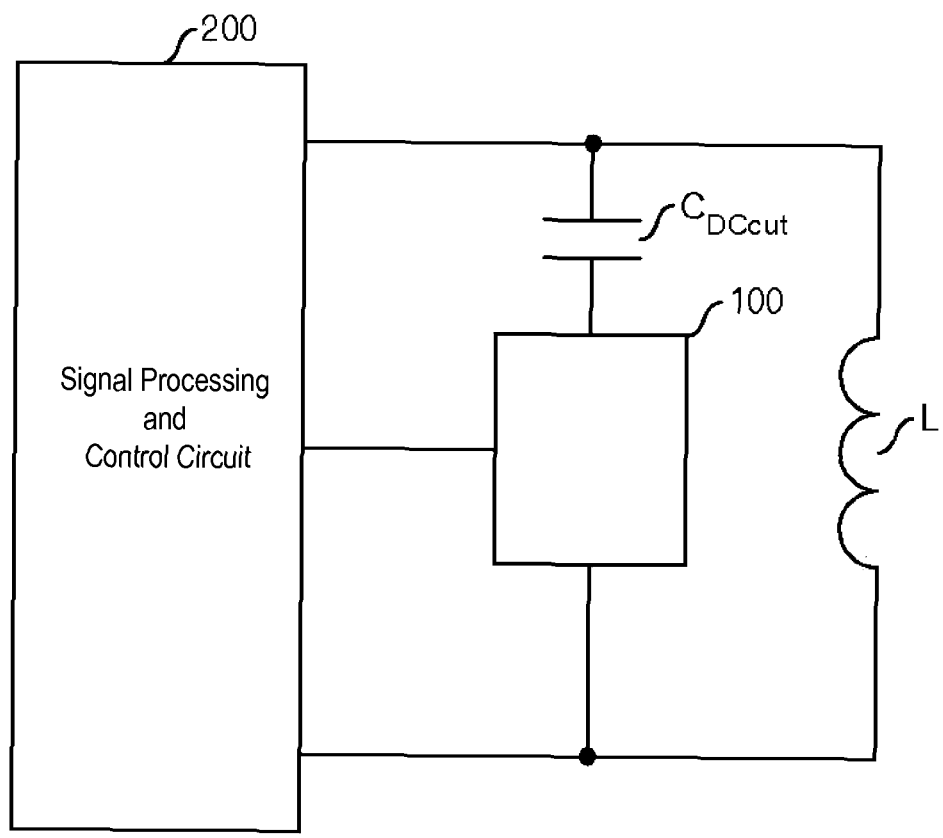
FIG. 8 illustrates an example configuration of an antenna device.

An antenna device that utilizes a variable capacitance device 100 according to the present embodiment has a configuration similar to that shown in FIG. 8, for example. The antenna device has: a signal processing and control circuit 200, a capacitor $C_{DCcut}$ for cutting a voltage DC, a variable capacitance device 100, and a coil L used as an antenna. Since the signal processing and control circuit 200 is configured to properly demodulate signals received by the coil L, the circuit 200 will apply the appropriate voltage to the variable capacitance device 100.

If a variable capacitance device 100 according to the present embodiment is used, then when an antenna device similar to that mentioned above is produced, the variable capacitance device 100 can be mounted into the antenna device without concern for whether the variable capacitance device 100 is facing to the left or to the right.

An example in which four variable capacitance elements were connected in series was shown in FIG. 3. The number of variable capacitance elements may be any even number greater than or equal to 2, however.

Figure 9:
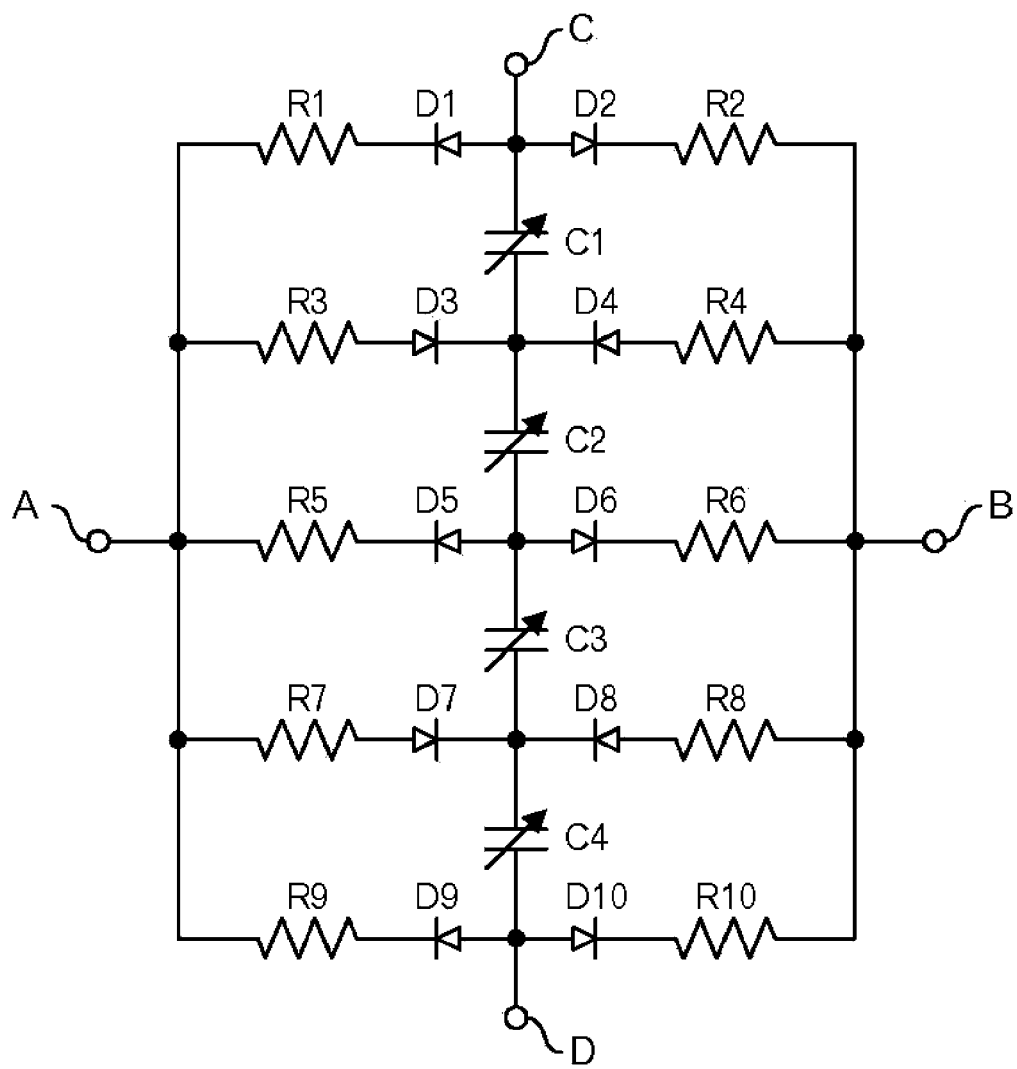
FIG. 9 illustrates Modification Example 1 of Embodiment 1.

Furthermore, in the examples mentioned above, elements were disposed so that, in each of the series circuits, the resistors were closer than the diodes to the variable capacitance elements C1 to C4. As shown in FIG. 9, however, the elements may be disposed in a reverse order in which the diodes are closer than the resistors to the variable capacitance elements C1 to C4.

Figure 10:
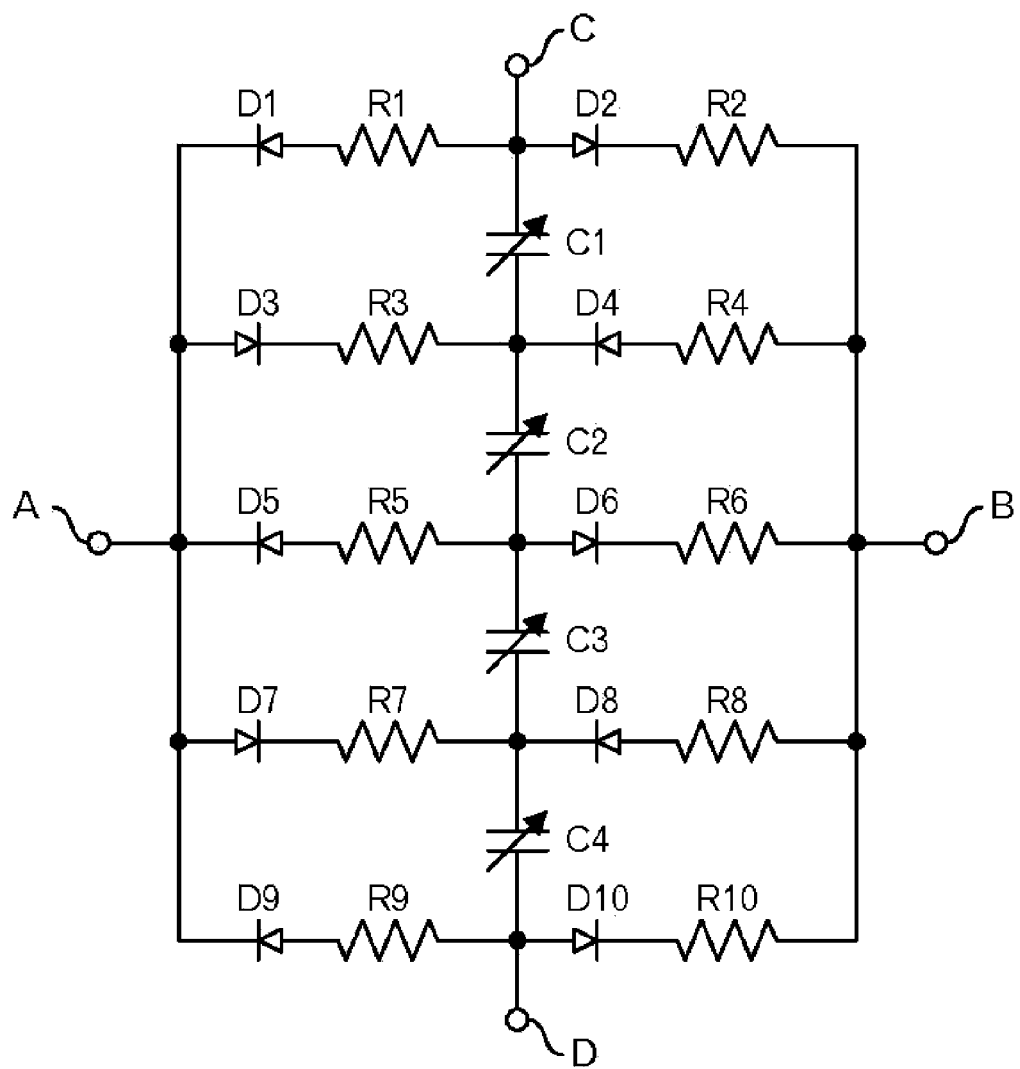
FIG. 10 illustrates Modification Example 2 of Embodiment 1.

Moreover, in the examples mentioned above, the series circuits were disposed so as to be axisymmetric about a straight line passing through the variable capacitance elements C1 to C4. As shown in FIG. 10, however, there are cases in which the circuits on one side of the device, for example, are disposed so that the diodes are closer than the resistors to the variable capacitance elements C1 to C4.

Moreover, the order of the diodes and the resistors may be any desired order in each of the series circuits.

Embodiment 2

Figure 11:
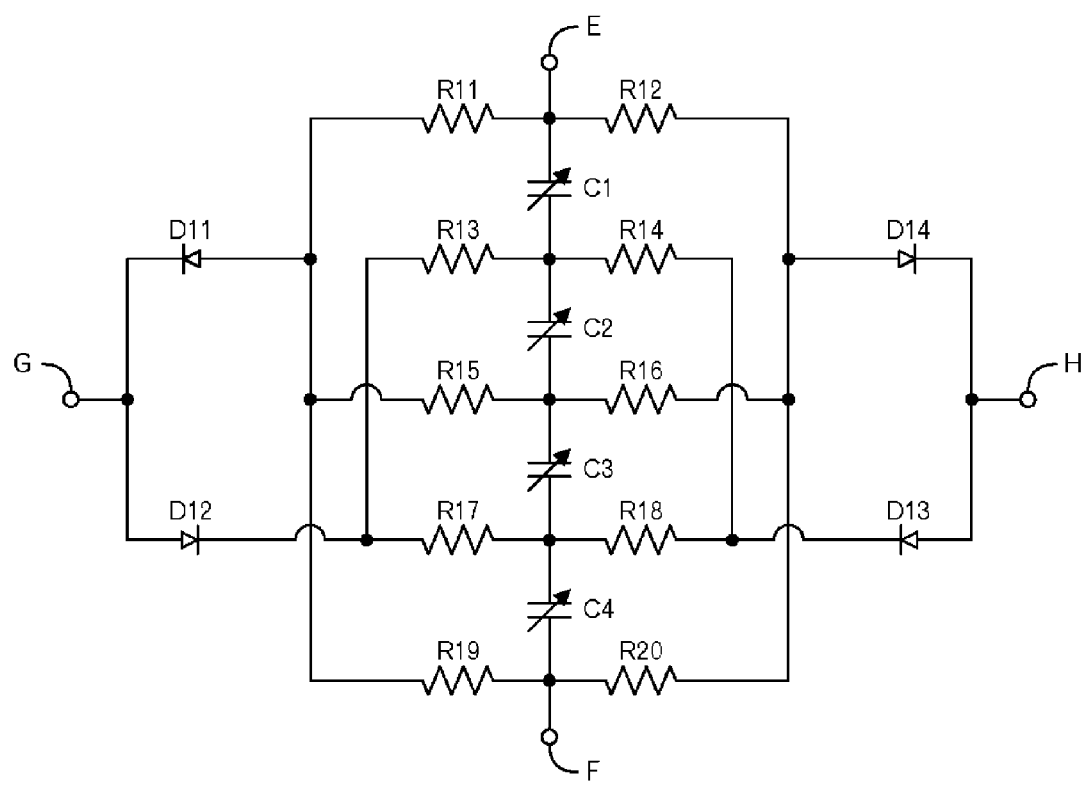
FIG. 11 illustrates an example circuit configuration of a variable capacitance device according to Embodiment 2 of the present invention.

FIG. 11 illustrates an example circuit in a variable capacitance device according to Embodiment 2 of the present invention. In the present embodiment, variable capacitance elements C1 to C4 are connected in series between terminals E and F, which are used for processing signals. The variable capacitance device according to the present embodiment also has diodes D11 to D14 and resistors R11 to R20. The diodes D11 to D14 all have identical properties, and the resistors R11 to R20 have an identical resistance, for example. In this way, the diodes D1, D5, and D9 from Embodiment 1 are combined to form the diode D11, the diodes D3, D7 are combined to form the diode D12, the diodes D2, D6, and D10 are combined to form diode D14, and the diodes D4, D8 are combined to form the diode D13.

In order for bias voltage applied between a terminal G and a terminal H to be transmitted to the terminal E end of the variable capacitance element C1, the connecting part of the variable capacitance element C1 and the variable capacitance element C2, the connecting part of the variable capacitance element C2 and the variable capacitance element C3, the connecting part of the variable capacitance element C3 and the variable capacitance element C4, and the terminal F end of the variable capacitance element C4, the first through fourth voltage application circuits are connected to the terminal G side and the terminal H side.

In the example shown in FIG. 11, the first voltage application circuits are provided such that current does not flow from terminal G to the connecting part of the variable capacitance element C1 and the terminal E, the connecting part of the variable capacitance element C2 and the variable capacitance element C3, and the connecting part of the variable capacitance element C4 and the terminal F. In other words, the first voltage application circuits include: the diode D11, of which the cathode is connected to the terminal G; the resistor R11, of which one end is connected to the anode of the diode D11 and the other end is connected to the connecting part of the variable capacitance element C1 and the terminal E; the resistor R15, of which one end is connected to the anode of the diode D11 and the other end is connected to the connecting part of the variable capacitance element C2 and the variable capacitance element C3; and the resistor R19, of which one end is connected to the anode of the diode D11 and the other end is connected to the connecting part of the variable capacitance element C4 and the terminal F. The resistors R11, R15, and R19 share the diode D11, and through this combination with the diode D11, substantially form the first, third, and fifth series circuits from Embodiment 1.

The third voltage application circuits are provided so that current flows from the terminal G to the connecting part of the variable capacitance element C1 and the variable capacitance element C2, and the connecting part of the variable capacitance element C3 and the variable capacitance element C4. In other words, the third voltage application circuits include: the diode D12, of which the anode is connected to the terminal G; the resistor R13, of which one end is connected to the cathode of the diode D12 and the other end is connected to the connecting part of the variable capacitance element C1 and the variable capacitance element C2; and the resistor R17, of which one end is connected to the cathode of the diode D12 and the other end is connected to the connecting part of the variable capacitance element C3 and the variable capacitance element C4. The resistors R13, R17 share the diode D12, and through this combination with the diode D12, substantially form the second and fourth series circuits from Embodiment 1.

In a similar manner, the fourth voltage application circuits are provided so that current does not flow from the terminal H to the connecting part of the variable capacitance element C1 and the terminal E, the connecting part of the variable capacitance element C2 and the variable capacitance element C3, and the connecting part of the variable capacitance element C4 and the terminal F. In other words, the fourth voltage application circuits include: the diode D14, of which the cathode is connected to the terminal H; the resistor R12, of which one end is connected to the anode of the diode D14 and the other end is connected the connecting part of the variable capacitance element C1 and the terminal E; the resistor R16, of which one end is connected to the anode of the diode D14 and the other end is connected to the connecting part of the variable capacitance element C2 and the variable capacitance element C3; and the resistor R20, of which one end is connected to the anode of the diode D14 and the other end is connected to the connecting part of the variable capacitance element C4 and the terminal F. The resistors R12, R16, and R20 share the diode D14, and through this combination with the diode D14, substantially form the sixth, eighth, and tenth series circuits from Embodiment 1.

The second voltage application circuits are provided so that current flows from the terminal H to the connecting part of the variable capacitance element C1 and the variable capacitance element C2, and the connecting part of the variable capacitance element C3 and the variable capacitance element C4. In other words, the second voltage application circuits include: the diode D13, of which the anode is connected to the terminal H; the resistor R14, of which one end is connected to the cathode of the diode D13 and the other end is connected to the connecting part of the variable capacitance element C1 and the variable capacitance element C2; and the resistor R18, of which one end is connected to the cathode of the diode D13 and the other end is connected to the connecting part of the variable capacitance element C3 and the variable capacitance element C4. The resistors R14, R18 share the diode D13, and through this combination with the diode D13, substantially form the seventh and ninth series circuits from Embodiment 1.

In this way, the third voltage application circuits and the first voltage application circuits connected to terminal G are connected, in alternating order, to the connecting part of the terminal E and the variable capacitance element C1, the connecting part of the variable capacitance element C1 and the variable capacitance element C2, the connecting part of the variable capacitance element C2 and the variable capacitance element C3, the connecting part of the variable capacitance element C3 and the variable capacitance element C4, and the connecting part of the variable capacitance element C4 and the terminal D.

In a similar manner, the fourth voltage application circuits and the second voltage application circuits connected to the terminal H are connected, in alternating order, to the connecting part of the terminal E and the variable capacitance element C1, the connecting part of the variable capacitance element C1 and the variable capacitance element C2, the connecting part of the variable capacitance element C2 and the variable capacitance element C3, the connecting part of the variable capacitance element C3 and the variable capacitance element C4, and the connecting part of the variable capacitance element C4 and the terminal D.

As a result, as can be seen from FIG. 11, the first and third voltage application circuits and the second and fourth voltage application circuits are symmetric with respect to a straight line that connects the terminal E and the terminal F.

Figure 12:
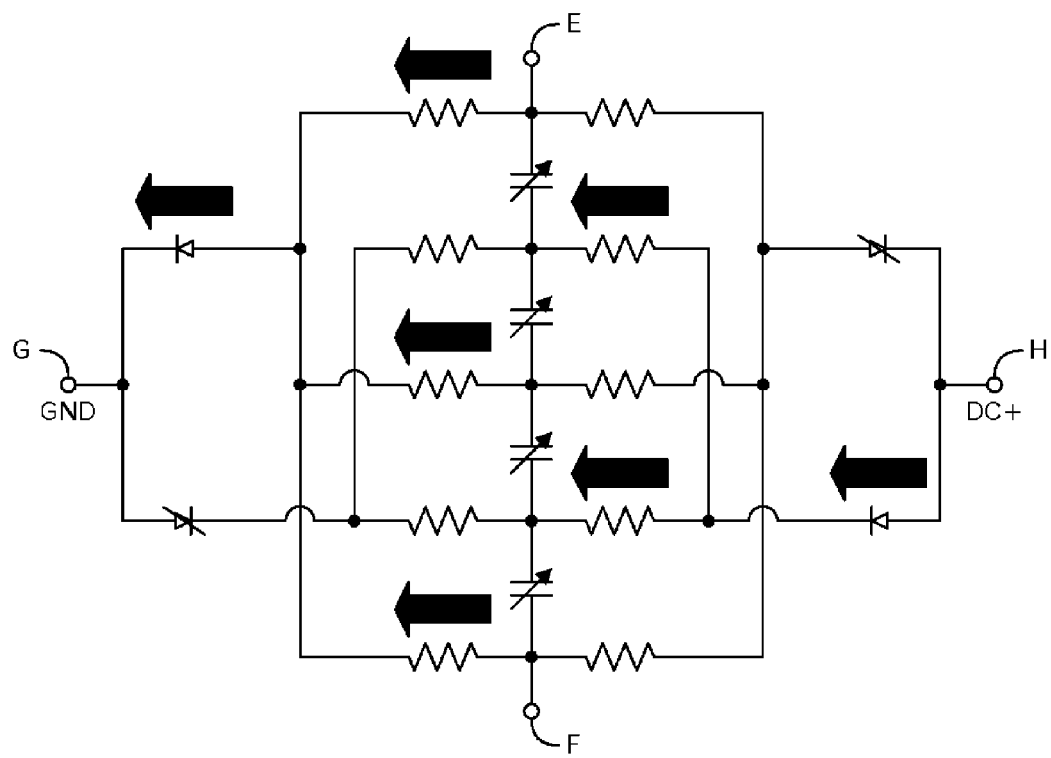
FIG. 12 schematically illustrates the flow of current in Embodiment 2 when a bias voltage is applied in a first direction.

As shown in FIG. 12, by using such a configuration, current flows in the first voltage application circuits and the second voltage application circuits in the manner indicated by the arrows when the terminal G is connected to the ground GND and DC+ is applied at the terminal H. In this way, in two ladder-like series resistors disposed to either side of the variable capacitance elements C1 to C4, a resistance is realized with respect to current that flows from the terminal H to the terminal G, the current alternating, segment-to-segment, between the left and the right sides of the variable capacitance elements C1 to C4. In other words, a bias voltage is applied to all of the variable capacitance elements C1 to C4.

Figure 13:
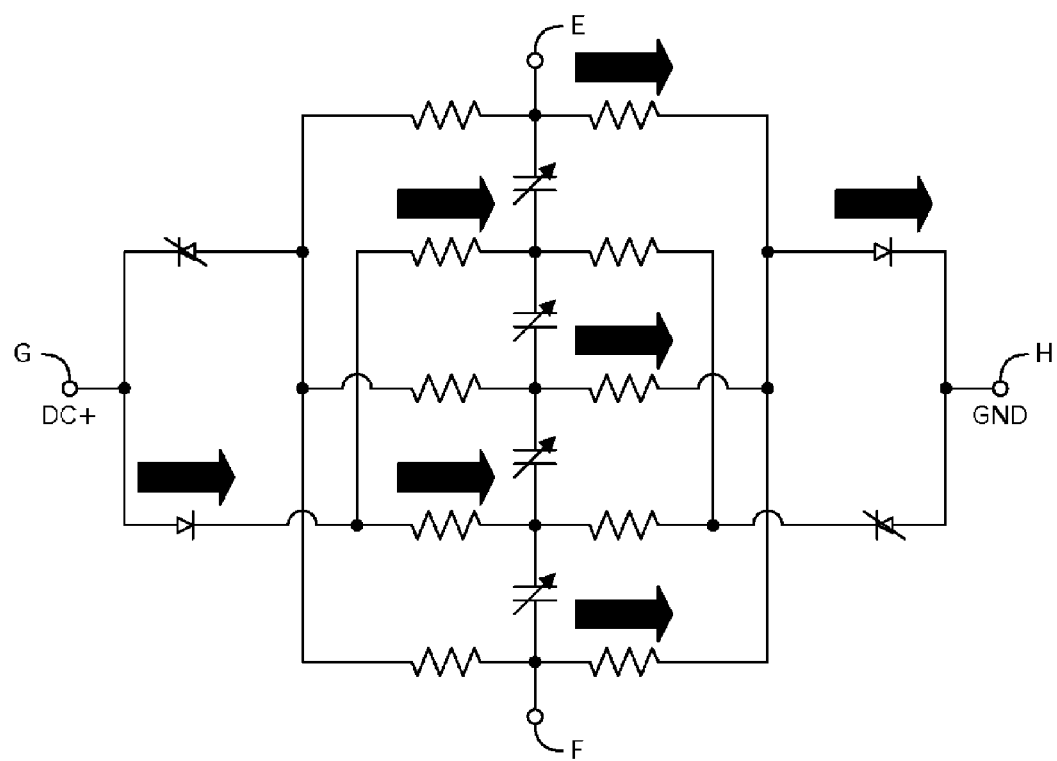
FIG. 13 schematically illustrates the flow of current in Embodiment 2 when a bias voltage is applied in a second direction.

Meanwhile, as shown in FIG. 13, current flows in the third voltage application circuits and the fourth voltage application circuits in the manner indicated by the arrows when terminal H is connected to the ground GND and DC+ is applied to the terminal G. Also in the example shown in FIG. 13, in two ladder-like series resistors disposed to either side of the variable capacitance elements C1 to C4, a resistance is realized with respect to current that flows from the terminal G to the terminal H, the current alternating, segment-to-segment, between the left and the right sides of the variable capacitance elements C1 to C4. In other words, a bias voltage is applied to all of the variable capacitance elements C1 to C4.

Even in instances when such a configuration is used, the change in capacitance shown in FIG. 6, which showed data for Embodiment 1, can be achieved.

Furthermore, such a configuration may be mounted as a small film on a cuboid variable capacitance device 100 such as that shown in FIG. 7.

Moreover, as shown in FIG. 8, the variable capacitance device 100 may be configured so as to be used in an antenna device.

In this way, even if the variable capacitance device 100 of the present embodiment is used, when such an antenna device is manufactured, the variable capacitance device 100 can be mounted into the antenna device without concern for which direction the variable capacitance device 100 is facing.

An example in which four variable capacitance elements are connected in series was shown in FIG. 11; however, the number of variable capacitance elements may be any even number greater than or equal to 2.

The above-mentioned embodiments of the present invention are summarized below.

A variable capacitance device according to Embodiment 1 has: (A) first and second terminals for processing signals and third and fourth terminals for receiving bias voltage; (B) a plurality of variable capacitance elements connected in series between the first and second terminals; (C) a plurality of first and second voltage application circuits which allow current to flow in a first direction; and (D) third and fourth voltage application circuits which allow current to flow in a second direction that is opposite to the first direction. In addition, one of the plurality of first voltage application circuits and one of the plurality of third voltage application circuits are connected at the edge on the first terminal side of the variable capacitance element closest to the first terminal, one of the plurality of first voltage application circuits and one of the plurality of third voltage application circuits are connected at the edge on the second terminal side of the variable capacitance element closest to the second terminal, and one of the plurality of first voltage application circuits and one of the plurality of third voltage application circuits are connected at each connecting part where two of the plurality of variable capacitance elements are connected (d1). In addition, the first voltage application circuits and the third voltage application circuits are alternately connected from the variable capacitance element closest to the first terminal toward the variable capacitance element closest to the second terminal, in that order, with one end of the circuits being connected to the third terminal (d2). Moreover, the fourth voltage application circuits and the second voltage application circuits are alternately connected from the variable capacitance element closest to the first terminal toward the variable capacitance element closest to the second terminal, in that order, with one end of the circuits being connected to the fourth terminal (d3).

By using such a configuration of circuits, a variable capacitance device that does not have directionality can be formed since an appropriate voltage will be applied to each variable capacitance element, regardless of whether the third terminal or the fourth terminal is connected to the ground.

Furthermore, there are instances in which the each of the first to fourth voltage application circuits are series circuits in which a diode and a resistor are connected in series. Using such a configuration allows for the formation of a low cost device.

Moreover, the variable capacitance device may be configured such that the resistors from the series circuits are connected at: the first terminal end of the variable capacitance element closest to the first terminal, the second terminal end of the variable capacitance element closest to the second terminal, and each connecting part where two variable capacitance elements are connected. In such a case, the diodes in the series circuits are connected to the third and fourth terminals. In such a configuration, the voltage application circuits are disposed symmetrically with respect to the variable capacitance elements connected in series, which makes it easier to manufacture the device.

An antenna device that includes such a variable capacitance device can also be created.

A variable capacitance device according to Embodiment 2 has: (A) first and second terminals used to process signals; (B) third and fourth terminals used to receive bias voltage; (C) a plurality of variable capacitance elements connected in series between the first and second terminals; (D) first voltage application circuits that are connected to the third terminal and that allow current to flow in a first direction; (E) second voltage application circuits that are connected to the fourth terminal and that allow current to flow in the first direction; (F) third voltage application circuits that are connected to the third terminal and that allow current to flow in a second direction that is opposite to the first direction; and (G) fourth voltage application circuits that are connected to the fourth terminal and that allow current to flow in the second direction. The connecting parts of the first voltage application circuits and the fourth voltage application circuits and the connecting parts of the second voltage application circuits and the third voltage application circuits are alternately connected at a plurality of locations that include the first terminal end of the variable capacitance element closest to the first terminal, the connecting parts where two of the plurality of variable capacitance elements are connected, and the second terminal end of the variable capacitance element closest to the second terminal, the connecting parts of the voltage application circuits being alternately connected from the first terminal end of the variable capacitance element closest to the first terminal toward the second terminal end of the variable capacitance element closest to the second terminal.

By using such a configuration, a variable capacitance device that does not have directionality can be formed since an appropriate voltage will be applied to each variable capacitance element, regardless of whether the third terminal or the fourth terminal is connected to the ground.

The above-mentioned first voltage application circuits and third voltage application circuits may be respectively configured so as to include a plurality of combinations of diodes connected to the third terminal side and resistors connected to the diodes. In addition, the above-mentioned second voltage application circuits and fourth voltage application circuits may be respectively configured so as to include one or more combinations of diodes connected to the fourth terminal side and resistors connected to the diodes.

Meanwhile, the above-mentioned first voltage application circuits and third voltage application circuits may be respectively configured so as to include a diode connected to the third terminal side and a plurality of resistors connected to the diode. In addition, the above-mentioned second voltage application circuits and fourth voltage application circuits may be respectively configured so as to include a diode connected to the fourth terminal side and one or more resistors connected to the diode. A device with such a configuration can be produced at a lower cost.

The configurations described above were explained in detail using the embodiments, but are not limited to just the embodiments.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A variable capacitance device, comprising:
a first terminal and a second terminal for receiving signals to be processed;
a serial chain of a plurality of variable capacitance elements connected in series between the first terminal and the second terminal, each of the variable capacitance elements being configured to change a capacitance thereof in accordance with a voltage across the variable capacitance element;
a third terminal and a fourth terminal for receiving a bias voltage for adjusting a total capacitance between said first terminal and said second terminal;
a plurality of first bias voltage circuits that are each connected to the third terminal at one end and that each allow current to flow therein only in a first direction, another end of the plurality of first bias voltage circuits being connected to odd numbered nodes, respectively, as counted from the first terminal in the serial chain of the plurality of variable capacitance elements;
a plurality of second bias voltage circuits that are each connected to the fourth terminal at one end and that each allow current to flow therein only in the first direction, another end of the plurality of second bias voltage circuits being connected to even numbered nodes, respectively, as counted from the first terminal in the serial chain of the plurality of variable capacitance elements;
a plurality of third bias voltage circuits that are each connected to the third terminal at one end and that each allow current to flow therein in only a second direction that is opposite to said first direction, another end of the plurality of third bias voltage circuits being connected to the even numbered nodes, respectively, in the serial chain of the plurality of variable capacitance elements; and
a plurality of fourth bias voltage circuits that are each connected to the fourth terminal at one end and that each allow current to flow therein only in the second direction, another end of the plurality of fourth bias voltage circuits being connected to the odd numbered nodes, respectively, in the serial chain of the plurality of variable capacitance elements,
whereby one of the plurality of first bias voltage circuits and one of the plurality of fourth bias voltage circuits are connected to each of the odd numbered nodes in the serial chain of the plurality of variable capacitance elements, and one of the plurality of second bias voltage circuits and one of the plurality of third bias voltage circuits are connected to each of the even numbered nodes in the serial chain of the plurality of variable capacitance elements,
wherein each of the first and third bias voltage circuits includes a diode between the third terminal and the corresponding node so that the current in each of the first bias voltage circuits flows only in the first direction from the corresponding node to the third terminal, and so that the current in each of the third bias voltage circuits flows only in the second direction from the third terminal to the corresponding node, and
wherein each of the second and fourth bias voltage circuits includes a diode between the fourth terminal and the corresponding node so that the current in each of the second bias voltage circuits flows only in the first direction from the fourth terminal to the corresponding node, and so that the current in each of the fourth bias voltage circuits flows only in the second direction from the corresponding node to the fourth terminal.

2. The variable capacitance device according to claim 1, wherein in each of the first and third bias voltage circuits, said diode is connected to the third terminal and a resistor is connected to said diode, and
wherein in each of the second and fourth bias voltage circuits, said diode is connected to the fourth terminal and a resistor is connected to said diode.

3. The variable capacitance device according to claim 1, wherein in each of the first and third bias voltage circuits, said diode is connected to the corresponding node and a resistor is connected to said diode, and
wherein in each of the second and fourth bias voltage circuits, said diode is connected to the corresponding node and a resistor is connected to said diode.

4. The variable capacitance device according to claim 1, wherein in each of the first and third bias voltage circuits, said diode is connected to the third terminal and a resistor is connected to said diode, and
wherein in each of the second and fourth bias voltage circuits, said diode is connected to the corresponding node and a resistor is connected to said diode.

5. The variable capacitance device according to claim 1, wherein in each of the first and third bias voltage circuits, said diode is connected to the corresponding node and a resistor is connected to said diode, and
wherein in each of the second and fourth bias voltage, said diode is connected to the fourth terminal and a resistor is connected to said diode.

6. An antenna device, comprising:
an antenna; and
the variable capacitance device according to claim 1, connected to the antenna.

* * * * *